United States Patent
Lai et al.

(10) Patent No.: US 12,419,118 B2
(45) Date of Patent: Sep. 16, 2025

(54) CELL MODULE

(71) Applicant: INDUSTRIAL TECHNOLOGY RESEARCH INSTITUTE, Hsinchu (TW)

(72) Inventors: Chiou-Chu Lai, Zhubei (TW); Chun-Wei Su, Zhubei (TW); Yi-Chun Liu, Zhudong Township (TW); Hsin-Hsin Hsieh, Taipei (TW); Hsin-Chung Wu, Sihu Township (TW); En-Yu Pan, Zhubei (TW); Chin-Ping Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 11 days.

(21) Appl. No.: 18/525,139

(22) Filed: Nov. 30, 2023

(65) Prior Publication Data

US 2024/0304741 A1 Sep. 12, 2024

(30) Foreign Application Priority Data

Mar. 6, 2023 (TW) .................................. 112108139

(51) Int. Cl.
*H10F 19/80* (2025.01)
(52) U.S. Cl.
CPC ................................. *H10F 19/804* (2025.01)
(58) Field of Classification Search
CPC .................................................... H10F 19/804
See application file for complete search history.

(56) References Cited

U.S. PATENT DOCUMENTS

| | | |
|---|---|---|
| 2018/0047863 A1 | 2/2018 | Jeon et al. |
| 2019/0172962 A1 | 6/2019 | Lin et al. |
| 2019/0245478 A1 | 8/2019 | de Vries et al. |
| 2021/0202770 A1* | 7/2021 | Kuan ...................... B32B 17/10 |
| 2021/0234055 A1 | 7/2021 | Wang et al. |
| 2021/0343886 A1 | 11/2021 | Sharenko et al. |

(Continued)

FOREIGN PATENT DOCUMENTS

| | | |
|---|---|---|
| TW | 201349527 A | 12/2013 |
| TW | 201716212 A | 5/2017 |

(Continued)

OTHER PUBLICATIONS

Taiwanese Office Action and Search Report for Taiwanese Application No. 112108139, dated Dec. 27, 2023.

(Continued)

*Primary Examiner* — Tae-Sik Kang
(74) *Attorney, Agent, or Firm* — Birch, Stewart, Kolasch & Birch, LLP

(57) ABSTRACT

A cell module is provided. The cell module includes a first substrate; a second substrate disposed opposite to the first substrate; a cell unit disposed between the first substrate and the second substrate; a first thermosetting resin layer disposed between the cell unit and the first substrate; a first protective layer disposed between the cell unit and the first thermosetting resin layer; and a second thermosetting resin layer disposed between the cell unit and the second substrate. The first protective layer includes a first polymer, wherein the cross-linking degree of the first polymer is 0 to 42.3%.

8 Claims, 1 Drawing Sheet

(56) References Cited

U.S. PATENT DOCUMENTS

2022/0059713 A1   2/2022   Selten et al.
2022/0123162 A1   4/2022   Sharenko et al.

FOREIGN PATENT DOCUMENTS

TW    I647862 B      1/2019
TW    I726562 B      5/2021
TW    202126486 A    7/2021
TW    I738594 B      9/2021

OTHER PUBLICATIONS

Taiwanese Office Action for Taiwanese Application No. 113126571, dated Jan. 23, 2025.

* cited by examiner

CELL MODULE

CROSS REFERENCE TO RELATED APPLICATIONS

This application claims priority of Taiwan Patent Application No. 112108139, filed on Mar. 6, 2023, the entirety of which is incorporated by reference herein.

TECHNICAL FIELD

The disclosure relates to a cell module.

BACKGROUND

Electricity generation through solar power involves the collection of heat energy from the sun by solar module, which are then converted into electrical energy. Although no pollutants are generated during the electricity production process, solar modules have a certain lifespan. When the end of their lifespan is reached, the waste solar panels need to be replaced, which will generate a large amount of waste. Therefore, the issue of recycling and resource reuse has gradually emerged.

Taking the conventional silicon crystal solar module as an example, in order to extend its lifespan, thermosetting polymers are commonly used as encapsulating materials to encapsulate and fix polycrystalline or monocrystalline solar cell chips.

Once thermosetting polymers form intermolecular cross-linking network, solar chips cannot be separated from glass by heating the encapsulation film to melt them. Therefore, the conventional method includes directly crushing and disassembling the module and then incinerating it to decompose the encapsulation film at high temperature, in order to isolate the glass and chips.

Accordingly, one challenge encountered in the decomposition of conventional silicon crystal solar cell modules is how to remove the thermosetting plastic material so that the glass and chips can be extracted without damage for recycling.

Therefore, a novel design of solar cell module with high reliability and easy disassembly properties address the issue of recycling discarded modules in the industry.

SUMMARY

The cell module includes a first substrate; a second substrate disposed opposite to the first substrate; a cell unit disposed between the first substrate and the second substrate; a first thermosetting resin layer disposed between the cell unit and the first substrate; a first protective layer disposed between the cell unit and the first thermosetting resin layer; and, a second thermosetting resin layer disposed between the cell unit and the second substrate.

According to embodiments of the disclosure, the first protective layer includes a first polymer, wherein the cross-linking degree of the first polymer is 0% to 42.3%. Namely, the first polymer does not have a cross-linking degree or have a cross-linking degree less than or equal to 42.3%. According to some embodiments of the disclosure, the first polymer of the first protective layer may be a cross-linked polymer. When the cross-linking degree of the cross-linked polymer is less than or equal to 42.3%, a complete chip of the cell module of the disclosure can be obtained after disassembling.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
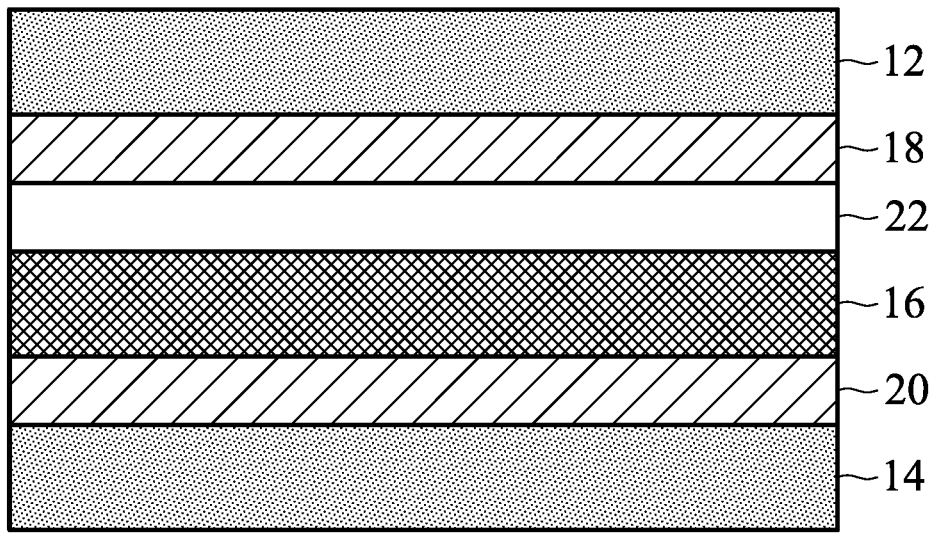
FIG. 1 is a cross-sectional view of the cell module 10 according to embodiments of the disclosure.

The cell module of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. As used herein, the term "about" in quantitative terms refers to plus or minus an amount that is general and reasonable to persons skilled in the art.

Furthermore, the use of ordinal terms such as "first", "second", "third", etc., in the disclosure to modify an element does not by itself connote any priority, precedence, order of one claim element over another or the temporal order in which it is formed, but are used merely as labels to distinguish one claim element having a certain name from another element having the same name (but for use of the ordinal term) to distinguish the claim elements.

It should be noted that the elements or devices in the drawings of the disclosure may be present in any form or configuration known to those skilled in the art. In addition, the expression "a layer overlying another layer", "a layer is disposed above another layer", "a layer is disposed on another layer", and "a layer is disposed over another layer" may refer to a layer that directly contacts the other layer, and they may also refer to a layer that does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

The disclosure provides a cell module, such as a solar cell module. According to embodiments of the disclosure, the cell module includes a first substrate, a first thermosetting resin layer, a first protective layer, a cell unit (such as solar cell chip), a second thermosetting resin layer, and a second substrate, wherein the first protective layer is disposed on the cell unit (i.e. the protective layer directly contacting the cell unit), and the first protective layer includes a first polymer.

The cell module of the disclosure can be easily disassembled and recycled by a simple thermal dissociation process or chemical dissociation process, which is not easy to cause fragmentation and has the advantage of easy disassembly. According to embodiments, a protective layer is introduced. The polymer used as the protective layer has high-temperature flowability, with its decomposition temperature equal to or higher than that of the thermosetting resin layer. According to some embodiments of the disclosure, when the first polymer has the specific cross-linking degree (such as 22.2% to 42.3%), the cell module of the disclosure can have good optical properties, high mechanical strength, high adhesion strength (without horizontal detachment, displacement and slippage), high reliability (anti-humidity and anti-UV), thereby meeting the requirements of the cell module.

According to embodiments of the disclosure, the disclosure provides a cell module 10, such as a solar cell module. FIG. 1 shows a cross-sectional view of the cell module 10 according to embodiments of the disclosure.

As shown in FIG. 1, the cell module 10 includes a first substrate 12, a second substrate 14, a cell unit 16, a first thermosetting resin layer 18, a second thermosetting resin layer 20, and a first protective layer 22. The first substrate 12 is disposed opposite to the second substrate 14. The cell unit 16 is disposed between the first substrate 12 and the second substrate 14. The first thermosetting resin layer 18 is disposed between the cell unit 16 and the first substrate 12. The second thermosetting resin layer 20 is disposed between the cell unit 16 and the second substrate 14. It should be noted that the first protective layer 22 is disposed between the cell unit 16 and the first thermosetting resin layer 18, and the first protective layer 22 may directly contact the cell unit 16. One side of the first thermosetting resin layer 18 contacts the first protective layer 22, and another side of the first thermosetting resin layer 18 contacts the first substrate 12. Namely, the first thermosetting resin layer 18 does not directly contact the cell unit 16. One side of the second thermosetting resin layer 20 contacts the cell unit 16, and another side of the second thermosetting resin layer 20 contacts the second substrate 14.

According to embodiments of the disclosure, the material of the first substrate 12 and the second substrate 14 may be glass, polyolefin resin (such as linear olefin polymer or cyclic olefin polymer), polycarbonate resin, or polyester resin (such as polyethylene terephthalate (PET)). According to embodiments of the disclosure, linear olefin polymer may be polyethylene (PE), polypropylene (PP), ethylene-acrylic acid copolymer (EAA), or copolymer of methyl methacrylate and styrene. According to embodiments of the disclosure, cyclic olefin polymer may be ethylene propylene diene monomer rubber (EPDM). In order to achieve the lightweight purpose of cell module 10, at least one of the first substrate 12 and the second substrate 14 may be prepared from polyolefin resin or polyester resin. According to embodiments of the disclosure, the thickness of the first substrate 12 and the second substrate 14 is not limited and may be optionally modified by a person of ordinary skill in the field.

According to embodiments of the disclosure, the first thermosetting resin layer 18 and the second thermosetting resin layer 20 may independently include ethylene vinyl acetate (EVA) resin, epoxy resin, polyolefin resin, polyurethane resin, diblock resin, triblock resin or a combination thereof. According to embodiments of the disclosure, when the first thermosetting resin layer 18 and the second thermosetting resin layer 20 are ethylene vinyl acetate (EVA) thermosetting resin, the amount of vinyl acetate (VA) in ethylene vinyl acetate (EVA) copolymer may be 25 wt % to 35 wt %. In some embodiments of the disclosure, the first thermosetting resin layer 18 and the second thermosetting resin layer 20 may further include an additive, such as curing initiator, antioxidant, cross-linking agent, or stabilizer. In some embodiments of the disclosure, the amount of the additive in the first thermosetting resin layer 18 or the second thermosetting resin layer 20 may be 1 wt % to 5 wt %. According to embodiments of the disclosure, the thickness of the first thermosetting resin layer 18 and the second thermosetting resin layer 20 is not limited and may be optionally modified by a person of ordinary skill in the field.

According to embodiments of the disclosure, the first protective layer 22 may include a first polymer. According to embodiments of the disclosure, the first polymer is not cross-linked, or the first polymer has a cross-linking degree less than or equal to 42.3%, such as 5%, 10%, 15%, 20%, 22.2%, 25%, 28%, 30%, 32%, 35%, 38%, or 40%. In addition, According to embodiments of the disclosure, the first protective layer 22 may consist of the first polymer.

According to embodiments of the disclosure, when the cross-linking degree of the first polymer is greater than 0% and less than 42.3%, the first polymer may be a product of a first composition via cross-linking reaction, wherein the first composition includes a first compound and a first cross-linking agent, wherein the amount of the first cross-linking agent may be 0.01 wt % to 1 wt % (such as 0.02%, 0.05%, 0.08%, 0.1%, 0.2%, 0.3%, 0.4%, 0.5%, 0.6%, 0.7%, 0.8%, or 0.9%), based on the weight of the first polymer.

According to embodiments of the disclosure, the first polymer may be polyethylene (PE), polypropylene (PP), ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, propylene-ethyl acrylate copolymer, epoxy resin, polyolefin resin, polyurethane resin, diblock resin, triblock resin or a combination thereof.

According to embodiments of the disclosure, the first cross-linking agent may be acrylate compound, methacrylate compound, allyl compound, vinyl compound, or a combination thereof. For example, the first cross-linking agent may be triallyl cyanurate (TAC), triallyl isocyanurate (TAIC), triallylphosphate (TAP), triallyl borate (TAB), trimethallyl isocyanurate (TMAIC), trimethylolpropane triacrylate (TMPTA), trimethylolpropane trimethacrylate, diallylterephthalate (DATP), diallyl carbonate, diallyl maleate, diallyl fumarate, diallyl phosphite, trimethylolpropane diallyl ether, 1,1,2,2-tetraallyloxyethane, or a combination thereof.

According to embodiments of the disclosure, the first composition can further include a first initiator, wherein the amount of the first initiator may be 0.01 wt % to 1 wt % (such as 0.02 wt %, 0.05 wt %, 0.08 wt %, 0.1 wt %, 0.2 wt %, 0.3 wt %, 0.4 wt %, 0.5 wt %, 0.6 wt %, 0.7 wt %, 0.8 wt %, or 0.9 wt %), based on the weight of the first polymer.

According to embodiments of the disclosure, the first initiator may be a photo-initiator, thermal initiator, or a combination thereof. According to embodiments of the disclosure, the first initiator is not limited and can be optionally modified by a person of ordinary skill in the field. The first initiator may be azo compound, cyanovaleric-acidbased compound, peroxide, benzoin-based compound, acetophenone-based compound, thioxanthone-based compound, ketal compound, benzophenone-based compound, α-aminoacetophenone compound, acylphosphineoxide compound, biimidazole-based compound, triazine-based compound, or a combination thereof.

According to embodiments of the disclosure, when the cross-linking degree of the first polymer is less than 22.2% (including 0%), the thickness of the first protective layer may be 100 µm to 350 µm (such as 150 µm, 200 µm, 250 µm, 300 µm). According to some embodiments of the disclosure, when the cross-linking degree of the first protective layer is 22.2% to 42.3%, the thickness of the first protective layer may be 100 µm to 500 µm (such as 150 µm, 200 µm, 250 µm, 300 µm, 350 µm, 400 µm, or 450 µm).

According to embodiments of the disclosure, the cell unit 16 may be solar cell chip (such as a solar cell module with a single light-receiving surface or a solar cell module with two light-receiving surfaces). According to embodiments of the disclosure, the solar cell chip used in the disclosure is not limited and can be optionally modified by a person of ordinary skill in the field.

According to embodiments of the disclosure, the first thermosetting resin layer 18 and the first protective layer 22 can form a transparent composite encapsulation film by bonding or co-extrusion process.

Figure 2:
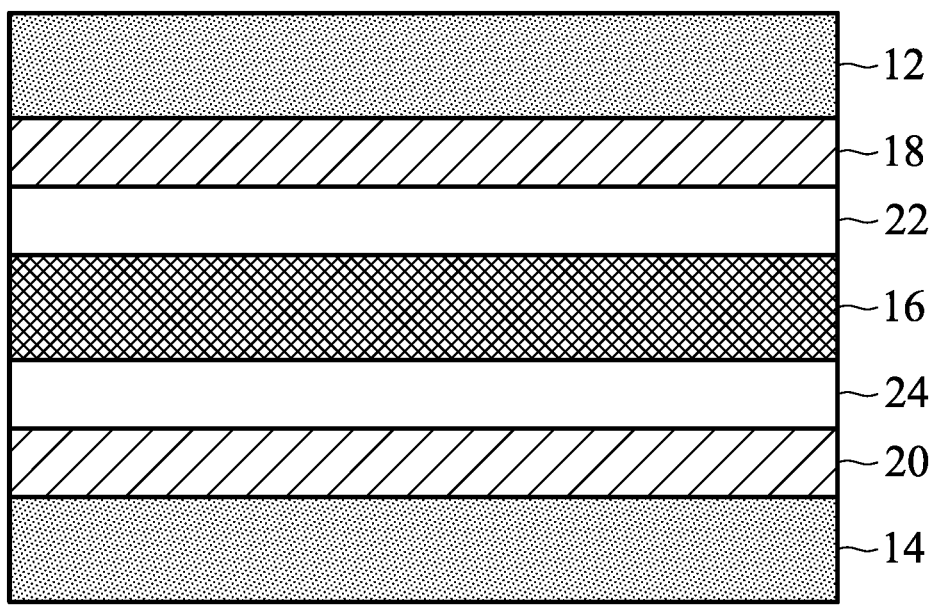
FIG. 2 is a cross-sectional view of the cell module 10 according to other embodiments of the disclosure.

According to embodiments of the disclosure, the cell module 10 of the disclosure can further include a second protective layer 24, as shown in FIG. 2. The second protective layer 24 may be disposed between the cell unit 16 and the second thermosetting resin layer 20. Namely, in the solar cell module 10 of the disclosure, the two sides of the cell unit 16 respectively contact the first protective layer 22 and the second protective layer 24. According to embodiments of the disclosure, the second thermosetting resin layer 20 and the second protective layer 24 can form another transparent composite encapsulation film by bonding or co-extrusion process. According to embodiments of the disclosure, when the cell unit 16 is disposed between the first protective layer 22 and the second protective layer 24, thereby further increases the dismantlability of the cell module 10.

According to embodiments of the disclosure, the thickness of the second protective layer 24 may be 100 µm to 500 µm (such as 150 µm, 200 µm, 250 µm, 300 µm, 350 µm, 400 µm, or 450 µm).

According to embodiments of the disclosure, the second protective layer 22 can include a second polymer. According to embodiments of the disclosure, the cross-linking degree of the second polymer may be 22.2% to 42.3%, such as 25%, 28%, 30%, 32%, 35%, 38%, or 40%. In addition, according to embodiments of the disclosure, the second protective layer 22 may consist of the second polymer.

According to embodiments of the disclosure, the second polymer may be a product of a second composition via cross-linking reaction, wherein the second composition includes a second compound and a second cross-linking agent, wherein the amount of the second cross-linking agent may be 0.01 wt % to 1 wt % (such as 0.02 wt %, 0.05 wt %, 0.08 wt %, 0.1 wt %, 0.2 wt %, 0.3 wt %, 0.4 wt %, 0.5 wt %, 0.6 wt %, 0.7 wt %, 0.8 wt %, or 0.9 wt %), based on the weight of the second polymer. According to embodiments of the disclosure, the first polymer and the second polymer may be the same or different. In addition, according to embodiments of the disclosure, the first cross-linking agent and the second cross-linking agent may be the same or different.

According to embodiments of the disclosure, the second polymer may be polyethylene (PE), polypropylene (PP), ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, propylene-ethyl acrylate copolymer, epoxy resin, polyolefin resin, polyurethane resin, diblock resin, triblock resin or a combination thereof.

According to embodiments of the disclosure, the second cross-linking agent may be an acrylate compound, methacrylate compound, allyl compound, vinyl compound, or a combination thereof. For example, the second cross-linking agent may be triallyl cyanurate (TAC), triallyl isocyanurate (TAIC), triallylphosphate (TAP), triallyl borate (TAB), trimethallyl isocyanurate (TMAIC), trimethylolpropane triacrylate (TMPTA), trimethylolpropane trimethacrylate, diallylterephthalate (DATP), diallyl carbonate, diallyl maleate, diallyl fumarate, diallyl phosphite, trimethylolpropane diallyl ether, 1,1,2,2-tetraallyloxyethane, or a combination thereof.

According to embodiments of the disclosure, the second composition can further include a second initiator, wherein the amount of the second initiator may be 0.01 wt % to 1 wt % (such as 0.02 wt %, 0.05 wt %, 0.08 wt %, 0.1 wt %, 0.2 wt %, 0.3 wt %, 0.4 wt %, 0.5 wt %, 0.6 wt %, 0.7 wt %, 0.8 wt %, or 0.9 wt %), based on the weight of the second polymer.

According to embodiments of the disclosure, the second initiator may be a photo-initiator, thermal initiator, or a combination thereof. According to embodiments of the disclosure, the initiator of the disclosure is not limited and may be optionally modified by a person of ordinary skill in the field, may be an azo compound, cyanovaleric-acid-based compound, peroxide, benzoin-based compound, acetophenone-based compound, thioxanthone-based compound, ketal compound, benzophenone-based compound, α-aminoacetophenone compound, acylphosphine oxide compound, biimidazole-based compound, triazine-based compound, or a combination thereof.

It should be noted that, the disclosure cell module 10 can be easily disassembled and recycled by thermal dissociation process or chemical dissociation process. According to embodiments of the disclosure, the thermal dissociation process is performed at a specific temperature (such as 400° C. to 500° C.) to bake the cell module 10 to disassemble the cell module 10. In some embodiments of the disclosure, the chemical dissociation process is performed at a temperature less than 40° C. In the chemical dissociation process, the cell module 10 is immersed in a solvent to disassemble the cell module 10. In some embodiments of the disclosure, the solvent used in the chemical dissociation process may be a hydrocarbon solvent, such as toluene, 2-toluene, hexane, or cyclohexane.

Below, exemplary embodiments will be described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Preparation of Polymer

Preparation Example 1

400 parts by weight of ethylene-vinyl acetate copolymer (EVA) (with a trade number of UE2828, commercially available from USI Corporation), 0.14 parts by weight of triallyl isocyanurate (TAIC) (commercially available from Shinryo Corp) (serving as cross-linking agent), 0.01 parts by weight of initiator (with a trade number of LUPEROX 101, commercially available from ATOFINA Chemicals), and 0.13 parts by weight of initiator (with a trade number of LUPEROX 117, commercially available from ATOFINA Chemicals) were mixed, obtaining Composition (1).

Next, Composition (1) was subjected to a thermocompression bonding process (pressed at 150° C. for about 15 minutes to 20 minutes) under vacuum, obtaining Polymer film (1) (with a thickness of about 500 μm). Next, the cross-linking degree of Polymer film (1) was measured, and the results are shown in Table 1, wherein the cross-linking degree was determined by the method according to ASTM-D2765.

Preparation Example 2

400 parts by weight of ethylene-vinyl acetate copolymer (EVA) (with a trade number of UE2828, commercially available from USI Corporation), 0.58 parts by weight of triallyl isocyanurate (TAIC) (commercially available from Shinryo Corp) (serving as cross-linking agent), 0.03 parts by weight of initiator (with a trade number of LUPEROX 101, commercially available from ATOFINA Chemicals), and 0.51 parts by weight of initiator (with a trade number of LUPEROX 117, commercially available from ATOFINA Chemicals) were mixed, obtaining Composition (2).

Next, Composition (2) was subjected to a thermocompression bonding process (pressed at 150° C. for about 15 minutes to 20 minutes) under vacuum, obtaining Polymer film (2) (with a thickness of about 500 μm). Next, the cross-linking degree of Polymer film (2) was measured, and the results are shown in Table 1.

Preparation Example 3

400 parts by weight of ethylene-vinyl acetate copolymer (EVA) (with a trade number of UE2828, commercially available from USI Corporation), 0.864 parts by weight of triallyl isocyanurate (TAIC) (commercially available from Shinryo Corp) (serving as cross-linking agent), 0.05 parts by weight of initiator (with a trade number of LUPEROX 101, commercially available from ATOFINA Chemicals), and 0.77 parts by weight of initiator (with a trade number of LUPEROX 117, commercially available from ATOFINA Chemicals) were mixed, obtaining Composition (3).

Next, Composition (3) was subjected to a thermocompression bonding process (pressed at 150° C. for about 15 minutes to 20 minutes) under vacuum, obtaining Polymer film (3) (with a thickness of about 500 μm). Next, the cross-linking degree of Polymer film (3) was measured, and the results are shown in Table 1.

Preparation Example 4

400 parts by weight of ethylene-vinyl acetate copolymer (EVA) (with a trade number of UE2828, commercially available from USI Corporation) was subjected to a thermocompression bonding process (pressed at 150° C. for about 15 minutes to 20 minutes) under vacuum, obtaining Polymer film (4) (with a thickness about 350 μm). Next, the cross-linking degree of Polymer film (4) was measured, and the results are shown in Table 1.

Preparation Example 5

400 parts by weight of ethylene-vinyl acetate copolymer (EVA) (with a trade number of UE2828, commercially available from USI Corporation), 0.07 parts by weight of triallyl isocyanurate (TAIC) (commercially available from Shinryo Corp) (serving as cross-linking agent), 0.01 parts by weight of initiator (with a trade number of LUPEROX 101, commercially available from ATOFINA Chemicals), and 0.06 parts by weight of initiator (with a trade number of LUPEROX 117, commercially available from ATOFINA Chemicals) were mixed, obtaining Composition (4).

Next, Composition (4) was subjected to a thermocompression bonding process (pressed at 150° C. for about 15 minutes to 20 minutes) under vacuum, obtaining Polymer film (5) (with a thickness of about 500 μm). Next, the cross-linking degree of Polymer film (5) was measured, and the results are shown in Table 1.

Comparative Example 1

400 parts by weight of ethylene-vinyl acetate copolymer (EVA) (with a trade number of UE2828, commercially available from USI Corporation), 1.15 parts by weight of triallyl isocyanurate (TAIC) (commercially available from Shinryo Corp) (serving as cross-linking agent), 0.06 parts by weight of initiator (with a trade number of LUPEROX 101, commercially available from ATOFINA Chemicals), and 1.02 parts by weight of initiator (with a trade number of LUPEROX 117, commercially available from ATOFINA Chemicals) were mixed, obtaining Composition (5).

Next, Composition (5) was subjected to a thermocompression bonding process (pressed at 150° C. in for about 15 minutes to 20 minutes) under vacuum, obtaining Polymer film (6) (with a thickness of about 500 μm). Next, the cross-linking degree of Polymer film (6) was measured, and the results are shown in Table 1.

Comparative Example 2

400 parts by weight of ethylene-vinyl acetate copolymer (EVA) (with a trade number of UE2828, commercially available from USI Corporation), 1.73 parts by weight of triallyl isocyanurate (TAIC) (commercially available from Shinryo Corp) (serving as cross-linking agent), 0.1 parts by weight of initiator (with a trade number of LUPEROX 101, commercially available from ATOFINA Chemicals), and 1.54 parts by weight of initiator (with a trade number of LUPEROX 117, commercially available from ATOFINA Chemicals) were mixed, obtaining Composition (6).

Next, Composition (6) was subjected to a thermocompression bonding process (pressed at 150° C. for about 15 minutes to 20 minutes) under vacuum, obtaining Polymer film (7) (with a thickness of about 500 μm). Next, the cross-linking degree of Polymer film (7) was measured, and the results are shown in Table 1.

Preparation of Thermosetting EVA Film 400 parts by weight of thermosetting ethylene-vinyl acetate copolymer (EVA) (with a trade number of SV-15296P, commercially available from SVECK Technology) was subjected to a thermocompression bonding process (pressed at 150° C. for about 15 minutes to 20 minutes) under vacuum, obtaining the thermosetting EVA film. Next, the cross-linking degree of the thermosetting EVA film was measured, and the results are shown in Table 1.

TABLE 1

| | ethylene-vinyl acetate copolymer (UE2828) (parts by weight) | TAIC (parts by weight) | LUPEROX 101 (parts by weight) | LUPEROX 117 (parts by weight) | cross-linking degree of film (%) |
|---|---|---|---|---|---|
| Preparation Example 1 | 400 | 0.14 | 0.01 | 0.13 | 22.2 |
| Preparation Example 2 | 400 | 0.58 | 0.03 | 0.51 | 34.8 |
| Preparation Example 3 | 400 | 0.864 | 0.05 | 0.77 | 42.3 |
| Preparation Example 4 | 400 | 0 | 0 | 0 | 0 |
| Preparation Example 5 | 400 | 0.07 | 0.01 | 0.06 | 13.8 |
| Comparative Example 1 | 400 | 1.15 | 0.06 | 1.02 | 52.1 |
| Comparative Example 2 | 400 | 1.73 | 0.1 | 1.54 | 72.3 |
| thermosetting EVA film | thermosetting ethylene-vinyl acetate copolymer (with a trade number of SV-15296P) | | | | 85.3 |

Evaluation of Optical Properties

A first transparent glass (with a thickness of about 3.2 mm) (with a trade number of super clear glass, commercially available from TAIWAN GLASS IND. CORP.), a thermosetting EVA film (with a trade number of SV-15296P, commercially available from SVECK TECHNOLOGY) and a second transparent glass (with a thickness of about 3.2 mm) (with a trade number of super clear glass, commercially available from TAIWAN GLASS IND. CORP.) were provided. Disposed the second transparent glass, Polymer film (1), the thermosetting EVA film, and the first transparent glass sequentially. Next, the obtained structure was subjected to a thermocompression bonding process (pressed at 150° C. for about 15 minutes to 20 minutes) under vacuum, obtaining Laminate (1) (i.e. a laminate having a structure of second transparent glass/Polymer film (1)/thermosetting EVA film/first transparent glass). Next, the total luminous transmittance and haze of Laminate (1) were measured, and the results are shown in Table 2. The total luminous transmittance and haze were determined by the method according to ISO13468 via spectrophotometer under D65 illumination.

Example 2

Example 2 was performed in the same manner as in Example 1, except that Polymer film (1) was replaced with Polymer film (2), obtaining Laminate (2) (i.e. a laminate having a structure of second transparent glass/Polymer film (2)/thermosetting EVA film/first transparent glass). Next, the total luminous transmittance and haze of Laminate (2) were measured, and the results are shown in Table 2.

Example 3

Example 3 was performed in the same manner as in Example 1, except that Polymer film (1) was replaced with Polymer film (3), obtaining Laminate (3) (i.e. a laminate having a structure of second transparent glass/Polymer film (3)/thermosetting EVA film/first transparent glass). Next, the total luminous transmittance and haze of Laminate (3) were measured, and the results are shown in Table 2.

Example 4

Example 4 was performed in the same manner as in Example 1, except that Polymer film (1) was replaced with Polymer film (4), obtaining Laminate (4) (i.e. a laminate having a structure of second transparent glass/Polymer film (4)/thermosetting EVA film/first transparent glass). Next, the total luminous transmittance and haze of Laminate (4) were measured, and the results are shown in Table 2.

Example 5

Example 5 was performed in the same manner as in Example 1, except that Polymer film (1) was replaced with Polymer film (5), obtaining Laminate (5) (i.e. a laminate having a structure of second transparent glass/Polymer film (5)/thermosetting EVA film/first transparent glass). Next, the total luminous transmittance and haze of Laminate (5) were measured, and the results are shown in Table 2.

Example 6

A first transparent glass (with a thickness of about 3.2 mm) (with a trade number of super clear glass), a second transparent glass (with a thickness of about 3.2 mm) (with a trade number of super clear glass), a thermosetting EVA film (with a trade number of SV-15296P, commercially available from SVECK TECHNOLOGY) and a thermosetting polyolefin (POE) film (with a trade number of SE-556, commercially available from SVECK Technology) were provided. The second transparent glass, the Polymer film (1), the thermosetting POE film, the thermosetting EVA film, and the first transparent glass were disposed sequentially. Next, the obtained structure was subjected to a thermocompression bonding process (pressed at 150° C. for about 15 minutes to 20 minutes) under vacuum, obtaining Laminate (6) (i.e. a laminate having a structure of second transparent glass/Polymer film (1)/thermosetting POE film/thermosetting EVA film/first transparent glass). Next, the total luminous transmittance and haze of Laminate (6) were measured, and the results are shown in Table 2. The total luminous transmittance and haze were determined by the method according to ISO13468 via spectrophotometer under D65 illumination.

Example 7

Example 7 was performed in the same manner as in Example 1, except that the thermosetting EVA film was replaced with the thermosetting POE film (with a trade number of SE-556), obtaining Laminate (7) (i.e. a laminate having a structure of second transparent glass/Polymer film (1)/thermosetting POE film/first transparent glass). Next, the total luminous transmittance and haze of Laminate (7) were measured, and the results are shown in Table 2.

Comparative Example 3

Comparative Example 3 was performed in the same manner as in Example 1, except that Polymer film (1) was replaced with Polymer film (6), obtaining Laminate (8) (i.e. a laminate having a structure of second transparent glass/Polymer film (6)/thermosetting EVA film/first transparent glass). Next, the total luminous transmittance and haze of Laminate (8) were measured, and the results are shown in Table 2.

Comparative Example 4

Comparative Example 4 was performed in the same manner as in Example 1, except that Polymer film (1) was replaced with Polymer film (7), obtaining Laminate (9) (i.e. a laminate having a structure of second transparent glass/Polymer film (7)/thermosetting EVA film/first transparent glass). Next, the total luminous transmittance and haze of Laminate (9) were measured, and the results are shown in Table 2.

Comparative Example 5

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.) were provided, Disposed the first transparent glass, the thermosetting EVA film, and the second transparent glass sequentially. Next, the obtained structure was subjected to a thermocompression bonding process (pressed at 150° C. for about 15 minutes to 20 minutes) under vacuum, obtaining Laminate (10) (i.e. a laminate having a structure of second transparent glass/thermosetting EVA film/first transparent glass). Next, the total luminous transmittance and haze of Laminate (10) were measured, and the results are shown in Table 2.

TABLE 2

| | laminate structure | cross-linking degree of polymer film (%) | total luminous transmittance (%) | haze (%) |
|---|---|---|---|---|
| Example 1 | glass/Polymer film (1)/thermosetting EVA film/glass | 22.2 | 98.7 | 1.35 |
| Example 2 | glass/Polymer film (2)/thermosetting EVA film/glass | 34.8 | 98.71 | 1.06 |
| Example 3 | glass/Polymer film (3)/thermosetting EVA film/glass | 42.3 | 98.45 | 1 |
| Example 4 | glass/Polymer film (4)/thermosetting EVA film/glass | 0 | 97.89 | 2.35 |
| Example 5 | glass/Polymer film (5)/thermosetting EVA film/glass | 13.8 | 98.5 | 1.42 |
| Example 6 | glass/Polymer film (1)/thermosetting POE film/thermosetting EVA film/glass | 22.2 | 98.0 | 0.89 |
| Example 7 | glass/Polymer film (1)/thermosetting POE film/glass | 22.2 | 97.99 | 0.9 |
| Comparative Example 3 | glass/Polymer film (6)/thermosetting EVA film/glass | 52.1 | 97.99 | 0.88 |
| Comparative Example 4 | glass/Polymer film (7)/thermosetting EVA film/glass | 72.3 | 98.45 | 0.81 |
| Comparative Example 5 | glass/thermosetting EVA film/glass | 85.3 (thermosetting EVA film) | 98.28 | 0.79 |

As shown in Table 2, the laminates prepared by combining the polymer films of the disclosure and the thermosetting EVA film (i.e. the laminates of Examples 1-7) have high total luminous transmittance and low haze.

Evaluation of Mechanical Strength

Example 8

Polymer film (1) was disposed on the thermosetting EVA film. Next, the obtained structure was subjected to a thermocompression bonding process (pressed at 150° C. for about 15 minutes to 20 minutes) under vacuum, obtaining Laminate (11) (i.e. a laminate having a structure of Polymer film (1)/thermosetting EVA film) (with a thickness of about 0.5 mm to 1 mm). Next, the fracture strength and volume resistivity of Laminate (11) were measured, and the results are shown in Table 3. The fracture strength was determined by the method according to ASTM D 638, and the volume resistivity was determined by the method according to IEC 62788-1-2.

Example 9

Example 9 was performed in the same manner as in Example 8, except that Polymer film (1) was replaced with Polymer film (2), obtaining Laminate (12) (i.e. a laminate having a structure of Polymer film (2)/thermosetting EVA film) (with a thickness of about 0.5 mm to 1 mm). Next, the fracture strength and volume resistivity of Laminate (12) were measured, and the results are shown in Table 3.

Example 10

Example 10 was performed in the same manner as in Example 8, except that Polymer film (1) was replaced with Polymer film (3), obtaining Laminate (13) (i.e. a laminate having a structure of Polymer film (3)/thermosetting EVA film) (with a thickness of about 0.5 mm to 1 mm). Next, the fracture strength and volume resistivity of Laminate (13) were measured, and the results are shown in Table 3.

Example 11

Example 11 was performed in the same manner as in Example 8, except that Polymer film (1) was replaced with Polymer film (4), obtaining Laminate (14) (i.e. a laminate having a structure of Polymer film (4)/thermosetting EVA film) (with a thickness of about 0.5 mm to 1 mm). Next, the fracture strength and volume resistivity of Laminate (14) were measured, and the results are shown in Table 3.

Example 12

Example 12 was performed in the same manner as in Example 8, except that Polymer film (1) was replaced with Polymer film (5), obtaining Laminate (15) (i.e. a laminate having a structure of Polymer film (5)/thermosetting EVA film) (with a thickness of about 0.5 mm to 1 mm). Next, the fracture strength and volume resistivity of Laminate (15) were measured, and the results are shown in Table 3.

Example 13

Polymer film (1) and the thermosetting POE film were sequentially disposed on the thermosetting EVA film. Next, the obtained structure was subjected to a thermocompression bonding process (pressed at 150° C. for about 15 minutes to 20 minutes) under vacuum, obtaining Laminate (16) (i.e. a laminate having a structure of Polymer film (1)/thermosetting POE film/thermosetting EVA film). Next, the fracture strength and volume resistivity of Laminate (16) were measured, and the results are shown in Table 3.

Example 14

Polymer film (1) was disposed on the thermosetting POE film. Next, the obtained structure was subjected to a thermocompression bonding process (pressed at 150° C. for about 15 minutes to 20 minutes) under vacuum, obtaining Laminate (17) (i.e. a laminate having a structure of Polymer film (1)/thermosetting POE film). Next, the fracture strength and volume resistivity of Laminate (17) were measured, and the results are shown in Table 3.

Comparative Example 6

Comparative Example 6 was performed in the same manner as in Example 8, except that Polymer film (1) was replaced with Polymer film (6), obtaining Laminate (18) (i.e. a laminate having a structure of Polymer film (6)/thermosetting EVA film) (with a thickness of about 0.5 mm to 1 mm). Next, the fracture strength and volume resistivity of Laminate (18) were measured, and the results are shown in Table 3.

Comparative Example 7

Comparative Example 7 was performed in the same manner as in Example 8, except that Polymer film (1) was replaced with Polymer film (7), obtaining Laminate (19) (i.e. a laminate having a structure of Polymer film (7)/thermosetting EVA film)(with a thickness of about 0.5 mm to 1 mm). Next, the fracture strength and volume resistivity of Laminate (19) were measured, and the results are shown in Table 3.

Comparative Example 8

The fracture strength and volume resistivity of the thermosetting EVA film were measured, and the results are shown in Table 3.

TABLE 3

| | laminate structure | cross-linking degree of polymer film (%) | fracture strength (MPa) | volume resistivity (Ω · cm) |
|---|---|---|---|---|
| Example 8 | Polymer film (1)/ thermosetting EVA | 22.2 | 34.1 | 3.03E+14 |
| Example 9 | Polymer film (2)/ thermosetting EVA | 34.8 | 34.19 | 3.74E+14 |
| Example 10 | Polymer film (3)/ thermosetting EVA | 42.3 | 44.68 | 2.74E+14 |
| Example 11 | Polymer film (4)/ thermosetting EVA | 0 | 29.49 | 3.03E+13 |
| Example 12 | Polymer film (5)/ thermosetting EVA | 13.8 | 30.31 | 1.88E+14 |
| Example 13 | Polymer film (1)/ thermosetting POE/ thermosetting EVA | 22.2 | 36.97 | 8.24E+14 |
| Example 14 | Polymer film (1)/ thermosetting POE | 22.2 | 40.62 | 1.07E+15 |
| Comparative Example 6 | Polymer film (6)/ thermosetting EVA | 52.1 | 51.82 | 2.75E+14 |
| Comparative Example 7 | Polymer film (7)/ thermosetting EVA | 72.3 | 55.57 | 2.08E+14 |
| Comparative Example 8 | thermosetting EVA | 85.3 (thermosetting EVA film) | 23.74 | 8.72E+14 |

As shown in Table 3, the thermosetting EVA film exhibits a relatively low fracture strength. In addition, the laminates prepared by combining the polymer films of the disclosure and the thermosetting EVA film (i.e. laminates of Examples 8-14) exhibits high fracture strength and volume resistivity.

Evaluation of Adhesion Strength

Example 15

A first solar module back sheet (with a thickness of about 0.31 mm) (with a trade number of FFC-JW3020, commercially available from Jolywood), a thermosetting EVA film (with a trade number of SV-15297W, commercially available from SVECK TECHNOLOGY) and a second solar module back sheet (with a thickness of about 0.31 mm) (with a trade number of FFC-JW3020, commercially available from Jolywood) were provided. Disposed sequentially the first solar module back sheet, the thermosetting EVA film, Polymer film (1), the thermosetting EVA film, and the second solar module back sheet. Next, the obtained structure was subjected to a thermocompression bonding process (pressed at 150° C. for about 15 minutes to 20 minutes) under vacuum, obtaining Laminate (20) (i.e. a laminate having a structure of second solar module back sheet/ thermosetting EVA film/Polymer film (1)/thermosetting EVA film/first solar module back sheet). Next, the adhesion strength of Lamination (20) was measured, and the results are shown in Table 4. The adhesion strength was determined by the method according to ASTM D 3330.

Example 16

Example 16 was performed in the same manner as in Example 15, except that Polymer film (1) was replaced with Polymer film (2), obtaining Laminate (21) (i.e. a laminate having a structure of second solar module back sheet/ thermosetting EVA film/Polymer film (2)/thermosetting EVA film/first solar module back sheet). Next, the adhesion strength of Laminate (21) was measured, and the results are shown in Table 4.

Example 17

Example 17 was performed in the same manner as in Example 15, except that Polymer film (1) was replaced with Polymer film (3), obtaining Laminate (22) (i.e. a laminate having a structure of second solar module back sheet/ thermosetting EVA film/Polymer film (3)/thermosetting EVA film/first solar module back sheet). Next, the adhesion strength of Laminate (22) was measured, and the results are shown in Table 4.

Example 18

Example 18 was performed in the same manner as in Example 15, except that Polymer film (1) was replaced with Polymer film (4), obtaining Laminate (23) (i.e. a laminate having a structure of second solar module back sheet/thermosetting EVA film/Polymer film (4)/thermosetting EVA film/first solar module back sheet). Next, the adhesion strength of Laminate (23) was measured, and the results are shown in Table 4.

Comparative Example 9

Comparative Example 9 was performed in the same manner as in Example 15, except that Polymer film (1) was replaced with Polymer film (6), obtaining Laminate (24) (i.e. a laminate having a structure of second solar module back sheet/thermosetting EVA film/Polymer film (6)/thermosetting EVA film/first solar module back sheet). Next, the adhesion strength of Laminate (24) was measured, and the results are shown in Table 4.

Comparative Example 10

Comparative Example 10 was performed in the same manner as in Example 15, except that Polymer film (1) was replaced with Polymer film (7), obtaining Laminate (25) (i.e. a laminate having a structure of second solar module back sheet/thermosetting EVA film/Polymer film (7)/thermosetting EVA film/first solar module back sheet). Next, the adhesion strength of Laminate (22) was measured, and the results are shown in Table 4.

Comparative Example 11

A first solar module back sheet (with a thickness of about 0.31 mm) (with a trade number of FFC-JW3020, commercially available from Jolywood) and a second solar module back sheet (with a thickness of about 0.31 mm) (with a trade number of FFC-JW3020, commercially available from Jolywood) were provided. Disposed sequentially the first solar module back sheet, the thermosetting EVA film, the thermosetting EVA film, and the second solar module back sheet. Next, the obtained structure was subjected to a thermocompression bonding process (with a temperature of 150° C. in a time period of about 15 minutes to 20 minutes) under vacuum, obtaining Lamination (26) (i.e. a laminate having a structure of second solar module back sheet/thermosetting EVA film/thermosetting EVA film/first solar module back sheet). Next, the adhesion strength of Laminate (26) was measured, and the results are shown in Table 4.

TABLE 4

| | laminate structure | cross-linking degree of polymer film (%) | adhesion strength |
|---|---|---|---|
| Example 15 | back sheet/thermosetting EVA film/Polymer film (1)/thermosetting EVA film/back sheet | 22.2 | 33.09 |
| Example 16 | back sheet/thermosetting EVA film/Polymer film (2)/thermosetting EVA film/back sheet | 34.8 | 33.6 |
| Example 17 | back sheet/thermosetting EVA film/Polymer film (3)/thermosetting EVA film/back sheet | 42.3 | 35 |
| Example 18 | back sheet/thermosetting EVA film/Polymer film (4)/thermosetting EVA film/back sheet | 0 | 33 |
| Comparative Example 9 | back sheet/thermosetting EVA film/Polymer film (6)/thermosetting EVA film/back sheet | 52.1 | 35.42 |
| Comparative Example 10 | back sheet/thermosetting EVA film/Polymer film (7)/thermosetting EVA film/back sheet | 72.3 | 42.6 |
| Comparative Example 11 | back sheet/thermosetting EVA film/thermosetting EVA film/back sheet | 85.3 (thermosetting EVA film) | 36.52 |

As shown in Table 4, the laminates prepared by combining the polymer films of the disclosure and the thermosetting EVA film (i.e. the laminates of Examples 15-18) still maintain good adhesion strength.

Solar Cell Module

Example 19

Herein, Solar cell module (1) was assembled to obtain the solar cell module as shown in FIG. 1. Materials and dimensions of the components of Solar cell module (1) were listed as following. The first substrate 12 was transparent glass (with a thickness of about 3.2 mm) (with a trade number of super clear glass, commercially available from TAIWAN GLASS IND. CORP.). The second substrate 14 was a solar module back sheet (with a trade number of FFC-JW3020, commercially available from Jolywood) (with a thickness of about 0.31 mm). The cell unit 16 was a solar cell chip (with a thickness of about 180 μm) (commercially available from Motech Industries, Inc.). The first thermosetting resin layer 18 was a thermosetting ethylene-vinyl acetate copolymer (EVA) film (with a trade number of SV-15296P, commercially available from SVECK TECHNOLOGY) (with a thickness of about 500 μm). The second thermosetting resin layer 20 was a thermosetting ethylene-vinyl acetate copolymer (EVA) film (with a trade number of SV-15297W, commercially available from SVECK TECHNOLOGY) (with a thickness of about 450 μm). The first protective layer 22 was Polymer film (1) of Composition (1) of Preparation Example 1 (with a thickness about 500 μm).

Example 20

Example 20 was performed in the same manner as in Example 19, except that the thickness of the first protective layer 22 was reduced from 500 μm to 350 μm, obtaining Solar cell module (2).

Example 21

Herein, Solar cell module (3) was assembled to obtain the solar cell module as shown in FIG. 2. Materials and dimensions of the components of Solar cell module (3) were listed as following. The first substrate 12 was a transparent glass (with a thickness of about 3.2 mm) (with a trade number of super clear glass, commercially available from TAIWAN GLASS IND. CORP.). The second substrate 14 was a solar module back sheet (with a trade number of FFC-JW3020, commercially available from Jolywood) (with a thickness of about 0.31 mm). The cell unit 16 was a solar cell chip (with a thickness of about 180 μm) (commercially available from Motech Industries, Inc.). The first thermosetting resin layer 18 was a thermosetting ethylene-vinyl acetate copolymer (EVA) film (with a trade number of SV-15296P, commercially available from SVECK TECHNOLOGY) (with a thickness of about 500 μm). The second thermosetting resin layer 20 was a thermosetting ethylene-vinyl acetate copolymer (EVA) film (with a trade number of SV-15297W, commercially available from SVECK TECHNOLOGY) (with a thickness of about 450 μm). The first protective layer 22 was Polymer film (1) of Composition (1) of Preparation Example 1 (with a thickness about 500 μm). The second protective layer 24 was Polymer film (1) of Composition (1) of Preparation Example 1 (with a thickness about 500 μm).

Example 22

Example 22 was performed in the same manner as in Example 21, except that the first protective layer 22 was Polymer film (2) of Composition (2) of Preparation Example 2 (with a thickness about 500 μm), obtaining Solar cell module (4).

Example 23

Example 23 was performed in the same manner as in Example 22, except that the thickness of the first protective layer 22 was reduced from 500 μm to 350 μm, obtaining Solar cell module (5).

Example 24

Example 24 was performed in the same manner as in Example 21, except that the first protective layer 22 was Polymer film (3) of Composition (3) of Preparation Example 3 (with a thickness about 500 μm), obtaining Solar cell module (6).

Example 25

Example 25 was performed in the same manner as in Example 24, except that the thickness of the first protective layer 22 was reduced from 500 μm to 350 μm, obtaining Solar cell module (7).

Example 26

Example 26 was performed in the same manner as in Example 21, except that the first protective layer 22 was Polymer film (4) of ethylene vinyl acetate copolymer (with a trade number of UE2828, commercially available from USI Corporation) (with a thickness about 350 μm), obtaining Solar cell module (8).

Example 27

Example 27 was performed in the same manner as in Example 21, except that the first protective layer 22 was Polymer film (5) of Composition (4) of Preparation Example 5 (with a thickness about 500 μm), obtaining Solar cell module (9).

Example 28

Example 28 was performed in the same manner as in Example 27, except that the thickness of the first protective layer 22 was reduced from 500 μm to 350 μm, obtaining Solar cell module (10).

Example 29

Example 29 was performed in the same manner as in Example 19, except that a thermosetting POE film (with a trade number of SE-556, commercially available from SVECK Technology) was inserted into the thermosetting EVA film (with a thickness of about 500 μm) and the first protective layer 22, obtaining Solar cell module (11). The first protective layer 22 was Polymer film (1) of Composition (1) of Preparation Example 1 (with a thickness about 500 μm).

Example 30

Example 30 was performed in the same manner as in Example 29, except that the thickness of the first protective layer 22 was reduced from 500 μm to 350 μm, obtaining Solar cell module (12).

Example 31

Example 31 was performed in the same manner as in Example 19, except that the first thermosetting resin layer 18 was replaced by a thermosetting POE film (with a trade number of SE-556, commercially available from SVECK Technology), obtaining Solar cell module (13).

Example 32

Example 32 was performed in the same manner as in Example 31, except that the thickness of the first protective layer 22 was reduced from 500 μm to 350 μm, obtaining Solar cell module (14).

Comparative Example 12

Comparative Example 12 was performed in the same manner as in Example 19, except that the first protective layer 22 was Polymer film (6) of Composition (5) of Comparative Example 1 (with a thickness about 500 μm), obtaining Solar cell module (15).

Comparative Example 13

Comparative Example 13 was performed in the same manner as in Comparative Example 12, except that the thickness of the first protective layer 22 was reduced from 500 μm to 350 μm, obtaining Solar cell module (16).

Comparative Example 14

Comparative Example 14 was performed in the same manner as in Example 19, except that the first protective layer 22 was Polymer film (7) of Composition (6) of Comparative Example 2 (with a thickness about 500 μm), obtaining Solar cell module (17).

Comparative Example 15

Comparative Example 15 was performed in the same manner as in Comparative Example 14, except that the thickness of the first protective layer 22 was reduced from 500 μm to 350 μm, obtaining Solar cell module (18).

Comparative Example 16

Comparative Example 16 was performed in the same manner as in Example 19, except that the first protective layer 22 was absent, obtaining Solar cell module (19).

Disassembly

Solar cell modules (1)-(19) of Examples 19-32 and Comparative Examples 12-16 were disassembled via a thermal dissociation process. First, the solar cell module was baked at 450° C. and the recycled solar cell chip was observed to determine its completeness. If the disassembled solar cell chip remains intact (without fragmentation or damage), it was marked with O. If the disassembled solar cell chip was broken, fragmented or damaged, it was marked with X. The results are shown in Table 5.

TABLE 5

|  | Solar cell module | cross-linking degree of protective layer (%) | thickness of protective layer (μm) | Disassembly results |
|---|---|---|---|---|
| Example 19 | Solar cell module (1) | 22.2 | 500 | ○ |
| Example 20 | Solar cell module (2) | 22.2 | 350 | ○ |
| Example 21 | Solar cell module (3) (solar cell chip disposed between two protective layers) | 22.2 | 500 | ○ |
| Example 22 | Solar cell module (4) | 34.8 | 500 | ○ |
| Example 23 | Solar cell module (5) | 34.8 | 350 | ○ |
| Example 24 | Solar cell module (6) | 42.3 | 500 | ○ |
| Example 25 | Solar cell module (7) | 42.3 | 350 | ○ |
| Example 26 | Solar cell module (8) | 0 | 350 | ○ |
| Example 27 | Solar cell module (9) | 13.8 | 500 | ○ |
| Example 28 | Solar cell module (10) | 13.8 | 350 | ○ |
| Example 29 | Solar cell module (11) | 22.2 | 500 | ○ |
| Example 30 | Solar cell module (12) | 22.2 | 350 | ○ |
| Example 31 | Solar cell module (13) | 22.2 | 500 | ○ |
| Example 32 | Solar cell module (14) | 22.2 | 350 | ○ |
| Comparative Example 12 | Solar cell module (15) | 52.1 | 500 | X |
| Comparative Example 13 | Solar cell module (16) | 52.1 | 350 | X |
| Comparative Example 14 | Solar cell module (17) | 72.3 | 500 | X |
| Comparative Example 15 | Solar cell module (18) | 72.3 | 350 | X |
| Comparative Example 16 | Solar cell module (19) | No protective layer | — | X |

As shown in Table 5, the solar cell modules of the disclosure (i.e. Solar cell modules (1)-(14) of Examples 19-32) could be disassembled via a thermal dissociation process (with a temperature of about 450° C.) and the recycled solar cell chips remain intact (without broken, fragmentation or damage) due to the specific cross-linking degree range (i.e. 0≤ cross-linking degree≤42.3%) of the polymer films employed by the protective layer and the specific thickness ($500 μm) of the protective layer. Therefore, the solar cell modules of the disclosure have the advantage of easy disassembly. In addition, when the solar cell module does not include the protective layer (or include a protective layer having a higher cross-linking degree than 42.3%) of the disclosure, the cell chips of the solar cell modules (i.e. solar cell modules (15)-(19) of Comparative Examples 12-16) could not remain intact after being disassembled via thermal dissociation process (with a temperature of about 450° C.).

Reliability Test (1) of Solar Cell Module

After hanging Solar cell modules (1), (3), (4), (6), (9), (11), and (13), of Examples 19, 21, 22, 24, 27, 29, and 31 at 120° C. for 144 hours, the Solar cell modules were observed whether a relative sliding between the glass and solar cell chip existed or not to determine the reliability of the solar cell modules. If no relative sliding between the glass and solar cell chip is observed after 144 hours, it is marked with O. If a relative sliding is observed within 144 hours, it is marked with X. The results are shown in Table 6.

TABLE 6

|  | Solar cell module | cross-linking degree of protective layer (%) | thickness of protective layer (μm) | reliability test |
|---|---|---|---|---|
| Example 19 | Solar cell module (1) | 22.2 | 500 | ○ |
| Example 21 | Solar cell module (3) (solar cell chip disposed between two protective layers) | 22.2 | 500 | ○ |
| Example 22 | Solar cell module (4) | 34.8 | 500 | ○ |
| Example 24 | Solar cell module (6) | 42.3 | 500 | ○ |
| Example 27 | Solar cell module (9) | 13.8 | 500 | X |
| Example 29 | Solar cell module (11) | 22.2 | 500 | ○ |
| Example 31 | Solar cell module (13) | 22.2 | 500 | ○ |

As shown in Table 6, the solar cell modules of the disclosure exhibit high reliability (without horizontal detachment, displacement and slippage) due to the specific cross-linking degree range (i.e. 22.2%≤ cross-linking degree≤42.3%) of the cross-linking polymer employed by the protective layer and the specific thickness (≤500 μm) of the protective layer.

Reliability Test (2) of Solar Cell Module

The electrical properties of Solar cell module (1) of Example 19 were measured. Further, after 1,000 hours of operation at high humidity (85% RH), the electrical properties of Solar cell module (1) were measured again, and the results are shown in Table 7.

TABLE 7

|  | Solar cell module (1) | |
|---|---|---|
| operating time (hours) | 0 | 1,000 |
| open circuit voltage (V) | 48.93 | 48.81 |
| short-circuit current (A) | 10.36 | 10.34 |
| maximum output voltage (Vmp) (V) | 41.10 | 40.96 |
| maximum output current (Imp) (A) | 9.86 | 9.85 |
| maximum output power (Pmp) (W) | 405.35 | 403.35 |
| filling factor (%) | 79.93 | 79.90 |

As shown in Table 7, after 1,000 hours of operation at high humidity (85% RH), the power loss of the solar cell module of the disclosure is less than 1%.

Reliability Test (3) of Solar Cell Module

Solar cell module (1) of Example 19 was irradiated with ultraviolet light at an integrated illuminance of 15 kWh/m². Next, the electrical properties of Solar cell module (1) were measured, and the results are shown in Table 8.

Solar cell module (1) of Example 19 was subjected to thermal cycle test according to IEC6121 (heated at 85° C., cooled at −40° C., and repeated 50 cycles). Next, the electrical properties of Solar cell module (1) were measured, and the results are shown in Table 8.

Solar cell module (1) of Example 19 was subjected to humidity-freeze test according to IEC61215 and IEC61730 (heated at 85° C., cooled at −40° C., and repeated 10 cycles with 85% RH). Next, the electrical properties of Solar cell module (1) were measured, and the results are shown in Table 8.

TABLE 8

| | Solar cell module (1) | | | |
|---|---|---|---|---|
| test condition | initial | UV test | thermal cycle test | humidity-freeze test |
| open circuit voltage (V) | 49.17 | 49.23 | 48.98 | 49.02 |
| short-circuit current (A) | 10.4 | 10.41 | 10.42 | 10.36 |
| maximum output voltage (Vmp) (V) | 41.25 | 40.99 | 40.87 | 40.85 |
| maximum output current (Imp) (A) | 9.88 | 9.96 | 9.94 | 9.87 |
| maximum output power (Pmp) (W) | 407.54 | 408.12 | 406.18 | 403.18 |
| filling factor (%) | 79.73 | 79.64 | 79.58 | 79.48 |

As shown in Table 8, after subjecting the solar cell module to UV test, thermal cycle test and humidity-freeze test, the power loss of the solar cell module of the disclosure is less than 1.5%.

Accordingly, by means of the specific protective layer and structural design, the cell module of the disclosure can have good optical properties, high mechanical strength, high adhesion strength (without horizontal detachment, displacement and slippage) and high reliability (anti-humidity, and anti-UV), thereby meeting the requirements of the cell module. In addition, the cell module of the disclosure can be easily disassembled and recycled by a simple thermal dissociation process or chemical dissociation process, which does not easy to cause fragmentation and has the advantage of easy disassembly. It should be noted that related encapsulation materials (such as ethylene vinyl acetate (EVA) resin, epoxy resin, polyolefin resin, polyurethane resin, diblock resin, triblock resin or a combination thereof) could be replaced based on the disclosure by persons skilled in the art in this technical field, due to similar cross-linking characteristics and fluidity.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cell module, comprising:
   a first substrate;
   a second substrate disposed opposite to the first substrate;
   a cell unit disposed between the first substrate and the second substrate;
   a first thermosetting resin layer disposed between the cell unit and the first substrate;
   a first protective layer disposed between the cell unit and the first thermosetting resin layer, wherein the first protective layer comprises a first polymer, and a cross-linking degree of the first polymer is 22.2% to 42.3%; and
   a second thermosetting resin layer disposed between the cell unit and the second substrate.

2. The cell module as claimed in claim 1, wherein the first protective layer has a thickness of 100 μm to 500 μm.

3. The cell module as claimed in claim 1, wherein the first polymer is a reaction product of a first composition, wherein the first composition comprises a first compound and a first cross-linking agent.

4. The cell module as claimed in claim 3, wherein the first compound is polyethylene, polypropylene, ethylene-vinyl acetate copolymer, ethylene-vinyl acetate rubber, ethylene-acrylic acid copolymer, ethylene-methacrylic acid copolymer, ethylene-methyl acrylate copolymer, ethylene-ethyl acrylate copolymer, ethylene-butyl acrylate copolymer, propylene-ethyl methacrylate copolymer, propylene-ethyl acrylate copolymer, epoxy resin, polyurethane resin, diblock resin, triblock resin or a combination thereof.

5. The cell module as claimed in claim 3, wherein the first cross-linking agent is acrylate compound, methacrylate compound, allyl compound, vinyl compound, triallyl cyanurate, triallyl isocyanurate, triallylphosphate, triallyl borate, trimethallyl isocyanurate, trimethylolpropane triacrylate, trimethylolpropane trimethacrylate, diallylterephthalate, diallyl carbonate, diallyl maleate, diallyl fumarate, diallyl phosphite, trimethylolpropane diallyl ether, 1, 1,2,2-tetraallyloxyethane, or a combination thereof.

6. The cell module as claimed in claim 1, further comprising:
   a second protective layer disposed between the cell unit and the second thermosetting resin layer.

7. The cell module as claimed in claim 6, wherein the second protective layer has a thickness of 100 μm to 500 μm.

8. The cell module as claimed in claim 6, wherein the second protective layer comprises a second polymer, and a cross-linking degree of the second polymer is 22.2% to 42.3%.

* * * * *